United States Patent
Zhan et al.

(10) Patent No.: US 10,595,418 B2
(45) Date of Patent: Mar. 17, 2020

(54) METHOD AND APPARATUS FOR IMPROVING DRILLING ELECTRONICS PERFORMANCE

(71) Applicants: China Petroleum & Chemical Corporation, Beijing (CN); Sinopec Tech Houston, LLC., Houston, TX (US)

(72) Inventors: Sheng Zhan, Houston, TX (US); Jinhai Zhao, Houston, TX (US); Fengtao Hu, Houston, TX (US); Herong Zheng, Houston, TX (US)

(73) Assignee: China Petroleum & Chemical Corporation, Beijing (CN)

( * ) Notice: Subject to any disclaimer, the term of this patent is extended or adjusted under 35 U.S.C. 154(b) by 294 days.

(21) Appl. No.: 15/858,844

(22) Filed: Dec. 29, 2017

(65) Prior Publication Data
US 2019/0208644 A1    Jul. 4, 2019

(51) Int. Cl.
| | |
|---|---|
| *H05K 3/30* | (2006.01) |
| *H05K 3/22* | (2006.01) |
| *H05K 3/26* | (2006.01) |
| *H05K 3/28* | (2006.01) |
| *H05K 1/03* | (2006.01) |

(52) U.S. Cl.
CPC ............. *H05K 3/305* (2013.01); *H05K 3/227* (2013.01); *H05K 3/26* (2013.01); *H05K 3/284* (2013.01); *H05K 1/0346* (2013.01); *H05K 2201/0116* (2013.01); *H05K 2201/0154* (2013.01); *H05K 2201/0162* (2013.01); *H05K 2201/10015* (2013.01); *H05K 2201/2009* (2013.01); *H05K 2203/0776* (2013.01); *H05K 2203/1105* (2013.01); *H05K 2203/163* (2013.01); *H05K 2203/176* (2013.01)

(58) Field of Classification Search
CPC .......... H05K 3/227; H05K 3/26; H05K 3/284; H05K 1/0346; H05K 2201/0116; H05K 2201/0154; H05K 2201/0162; H05K 2201/10015; H05K 2201/2009; H05K 2203/0776; H05K 2203/1105; H05K 2203/163; H05K 2203/176
See application file for complete search history.

(56) References Cited

U.S. PATENT DOCUMENTS 5,733,378 A * 3/1998 Berbel ................. B08B 3/08
                                                        134/10

\* cited by examiner

*Primary Examiner* — Vishal I Patel
(74) *Attorney, Agent, or Firm* — Novick, Kim & Lee, PLLC; Allen Xue

(57) ABSTRACT

In a method for preparing a printed circuit board assembly (PCBA), the PCBA has a base circuit board having a plurality of electronic components installed thereon. First, the surface of the PCBA is cleaned with a cleaner. After cleaning, the staking material is applied around the plurality of electronic components around the circumference of the plurality of electronic components. After applying the staking material, the PCBA with the staking material is cured and inspected.

16 Claims, 3 Drawing Sheets

METHOD AND APPARATUS FOR IMPROVING DRILLING ELECTRONICS PERFORMANCE

TECHNICAL FIELD

The present disclosure relates to electronic devices for high temperature drilling operations, particularly relates to methods for preparing a printed circuit board assembly (PCBA) suitable for downhole environment.

BACKGROUND

Modern oil and gas explorations are carried out in complex geologic settings. The drilling operations rely heavily on real time information on the status of the drilling tools as well as the earth formation properties. The information is obtained using sensors and measurement-while-drilling (MWD) and logging-while-drilling (LWD) instruments. Although MWD refers to the measurement of the movement and location of the drilling assembly while the drilling continues and LWD focuses more on the measurement of formation properties, they are used interchangeably in this disclosure. MWD/LWD instruments are often installed in the drill collar inside the drilling assembly (i.e., bottom hole assembly or BHA).

Sensors are employed to obtain measurements in the MWD/LWD instruments and the wireline logging approach. Other electronic components include active components, such as printed circuit board assemblies (PCBA) and transistors, or passive components, such as resistors and capacitors.

PCBAs are used throughout the drilling system. For example, they can be used in the operation of the power supply, temperature sensors, pressure transducers, the battery, etc. PCBAs such as the master memory board, the read out board, the transmitter or a receiver board, and the accelerometer board are among electronic devices commonly used in the downhole environment.

PCBAs can be coupled to various sensors in a drilling system by known methods. In some embodiments, sensors may be integrated on a master memory board. Sensors can be measurement sensors that monitor real-time conditions during a drilling process. For example, some sensors monitor the properties of earth formation such as resistivity, density, porosity, permeability, acoustic properties, nuclear-magnetic resonance properties, corrosive properties of the fluids or formation, and salt or saline contents. Other sensors monitor the condition of drilling tools, such as vibrations (lateral, torsional, axial, etc.), orientations, and accelerations in the drill bit or drill strings. Still other sensors monitor the temperature and pressure of the downhole environment. In other embodiments, sensors may be prognostic sensors. Prognostic sensors are subject to more severe conditions than in a typical drilling operation (e.g., higher temperature or pressure) so that they fail at an accelerated rate. They could be used to estimate the time of failure of another component.

Sensors can be mounted on any other suitable components in a drilling assembly. For example, they can be attached to a drill bit to monitor its movement or temperature. Sensors can also be mounted along the borehole, for example, to monitor the pressure or flow rate of the drilling mud along its path. Sensors (e.g., RFID) can even be put into the fluid in the drilling system and be dispersed into the earth formation.

A processor usually is installed on a PCBA. The processor is configured to receive, store, or execute data such as computer codes or sensor signals. For example, a processor can be coupled to a program module which supplies executable instructions and a recording medium that stores various results of calculations performed by the processor. Sensor signals are the input to the processor. A PCBA may also contain telemetry unit so it can transmit sensor signals to a surface instrument for further processing. Conversely, a PCBA may also receive inputs from a surface control unit.

Downhole drilling tools, especially the drilling assembly (a.k.a. BHA), are exposed to high temperatures, pressures, as well as vibrations and shocks. Conventional drilling may occur at a temperature up to 125° C. In contrast, bottom hole temperature may exceed 200° C. in deep wells. Such high temperatures drastically reduce the reliability and useful life of downhole electronic components due to leakage current, material degradation, outgassing, corrosion, etc. As a rule of thumb, for every 25° C. increase in temperature, an electronic component would lose 90% of its useful life. Therefore, there are great needs for electronic components that have an adequate operable life, e.g., from a few days to a few weeks, for high temperature drilling operations.

Staking is a process to install electronic components on a PCBA. For high temperature operation, some general principles apply. First, components shall not be bond in a manner that will impede strain relief, such as burying a lead in epoxy or applying a high CTE (Coefficient of Thermal Expansion) epoxy under a surface mount component or lead. Second, the bond shall be balanced. Third, staking material shall bond to both the electronics component and the circuit board. Finally, always consider the CTE of the staking material and performance impact it will have on electronic components that have a different CTE.

SUMMARY

The present disclosure provides a method for preparing a printed circuit board assembly (PCBA). The PCBA has a base circuit board having a plurality of electronic components installed thereon. First, the surface of the PCBA is cleaned with a cleaner. After cleaning, the staking material is applied around the plurality of electronic components around the circumference of the plurality of electronic components. After that, the PCBA with the staking material is cured and inspected.

In one embodiment, the cleaner is a material that does not degrade the base circuit board or the plurality of electronic components. An exemplary cleaner is isopropyl alcohol. After cleaning, the PCBA is dried at 120° C. to 130° C. for at least two hours.

In further embodiments, the PCBA has one or more stiffeners to increase a rigidity of the PCBA. The stiffener is made of the same material the base circuit board is made of.

BRIEF DESCRIPTION OF THE DRAWINGS

The teachings of the present invention can be readily understood by considering the following detailed description in conjunction with the accompanying drawing.

DETAILED DESCRIPTION

Figure 1A:
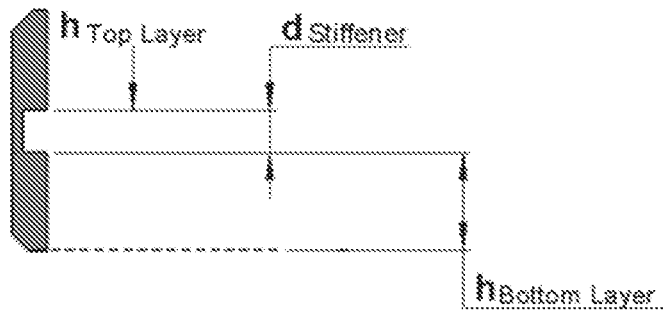
FIG. 1a and FIG. 1b show the dimension of the side-rail stiffener installed on the PCBA.

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Reference will now be made in detail to embodiments of the present disclosure, examples of which are illustrated in the accompanying drawings. It is noted that wherever practicable, similar or like reference numbers may be used in the drawings and may indicate similar or like elements.

In an embodiment of the current disclosure, the method for preparing a PCBA includes staking electronic components on a printed circuit board. First, the surface of the PCBA is prepared before staking. The surface preparation include cleaning the surface with an appropriate cleaner. The cleaner removes grease, oil, dirt, flux and other debris. A suitable cleaner shall be able to remove both ionic and nonionic contamination. It shall not degrade the material or parts being cleaned. Cleaned and reworked PCBA's shall be inspected for possible unwanted cleaning side effects. Cleaners may attack polymers or coatings such as epoxies and urethanes. Attacked parts shall be reworked to original condition (e.g. reapply glue on retaining screws, reapply thermal compounds on heat-sink components). Isopropyl-alcohol is an example of the cleaner. After being cleaned with a cleaner, the PCBA shall be dried, e.g., at 120° C. to 130° C. for 2 or more hours.

In some embodiments, connectors secured to PCBAs by means of fasteners are not staked. Fasteners are secured by means of high temperature Loctite threadlocker, e.g., Loctite #246. No staking material is applied to the top of screws or nuts. This avoids difficulties during the rework. Staking material on the top of screws or nuts is not necessary and does not improve the retention force. Do not allow the thread-locking compound to come in contact with the plastic component of the connector.

In other embodiments, connectors without hard fasteners are staked of the connector opposite the face and leads. The staking material is to be kept away from the face of the connector to prevent interference with the mating part.

In still other embodiments, stiffeners are used in the PCBA. PCBAs are typically equipped with delicate components which are soldered to the base circuit board. Any flexing of the PCBAs during handling and installation can cause solder joints to fail. To minimize flexing, stiffeners are installed on the PCBA to increase the rigidity of the assembly. For example, side-rail stiffeners can be installed on the edges of on a circuit board. There should be a one millimeter minimum clearance between the stiffener and the inside cavity wall. The gap is filled with encapsulated material for cushioning. The stiffener material shall be identical to the material of the PCB, e.g., polyimide.

Figure 1B:
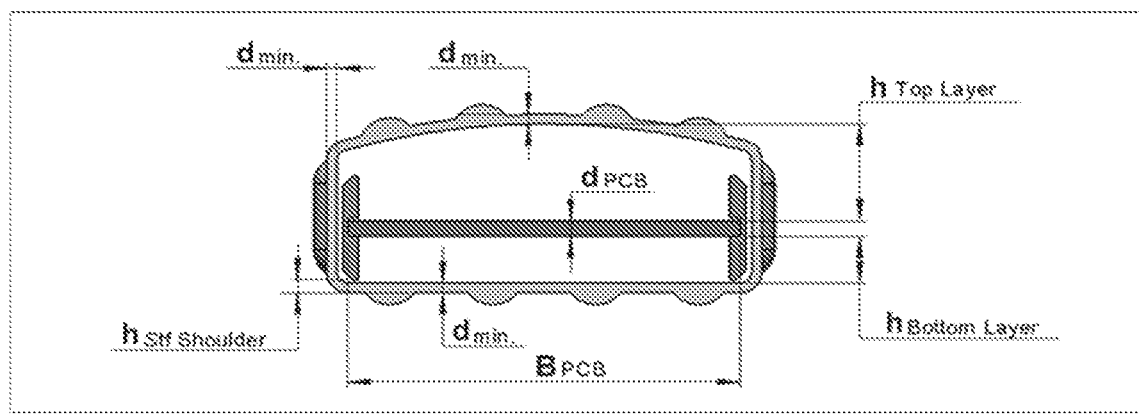

FIG. 1 shows the dimension of the side-rail stiffener, which can be calculated according to the following equations.

$h_{Top\_layer}$=height of electronic components mounted on top layer+1 mm $d_{stiffener}$=PCB thickness($d_{min}$,standard 1.60 mm,2.10 mm and 2.36 mm)+0.1 mm (clearance)

$h_{Bottom\_layer}$=height of electronic components mounted on bottom layer+1 mm Minimum wall thick($d_{min}$,standard 1.0 mm)

In further embodiments, the PCBA contains silicone foam pads. The pressure builds up inside a mold during the molding process. The pressure build during the heat cycle can cause component failure. In order to relieve the pressure loading, a closed cell silicone foam material is placed over the top of certain delicate electronic components. However, silicone foam pads are not be used if the material above the component is less than 4 mm.

In other embodiments, the PCBA has wrapped tantalum capacitors. All wrapped tantalum capacitors are staked along the full length of both sides of the component and at both ends inside the Kapton wrap. It is imperative that the Kapton tape is wrapped tightly to the body of the capacitor. Staking to a loosely wrapped capacitor will not secure the device to the PCBA and will cause a down-hole failure. Further, staking material is strictly kept away from the stress relief loops.

In still other embodiments of the PCBA, solid tantalum capacitors or resistors such as radial leaded tantalums (CK06 package or larger) and resistors (S102 Vishay or Caddock), as well as tansistors, are staked around the circumference of the device.

Further embodiments of the PCBA may have quartz or other crystal components installed on it. Staking for crystal packages differs through the variety of designs and follows the applicable Engineering documentation based on the requirements of the design. The PCBA may also contain transformers, either open or encapsulated, which are staked around the circumferences of the transformer.

In one of the final steps, the staking material is cured in accordance with the manufacturers recommended cure schedule. Staking material shall be tack-free when cured. For example, Loctite #5404 is cured at 130° C. for 60 minutes.

The PCBA can be repaired by replacing damaged components. For example, the staking material, e.g., Loctite #5404, can usually be removed by heating or a solvent or both. Care shall be taken to avoid any unwanted damage at electrical leads, traces and components. Glued or wrapped components that have been impacted shall be repaired to their original condition. Loctite #5404 can usually be removed by heating or a solvent or both. Care shall be taken to avoid any unwanted damage at electrical leads, traces and components.

The final inspection of the PCBA is performed after curing. For example, workmanship requirements is verified by visual inspection using a 10× power magnification. Finger pressure is applied to test tackiness and adhesion. In the final product, the staking material adheres to the intended surfaces, is free from contamination, is tack-free, and meets the hardness requirements.

In contrast, if the staking material has been used after its shelf life expiration, or it has cracks, or it does not adhere to the PCBA or its components, the PCBA should be reworked until the staking satisfies the specification.

Lab Tests

Figure 2:
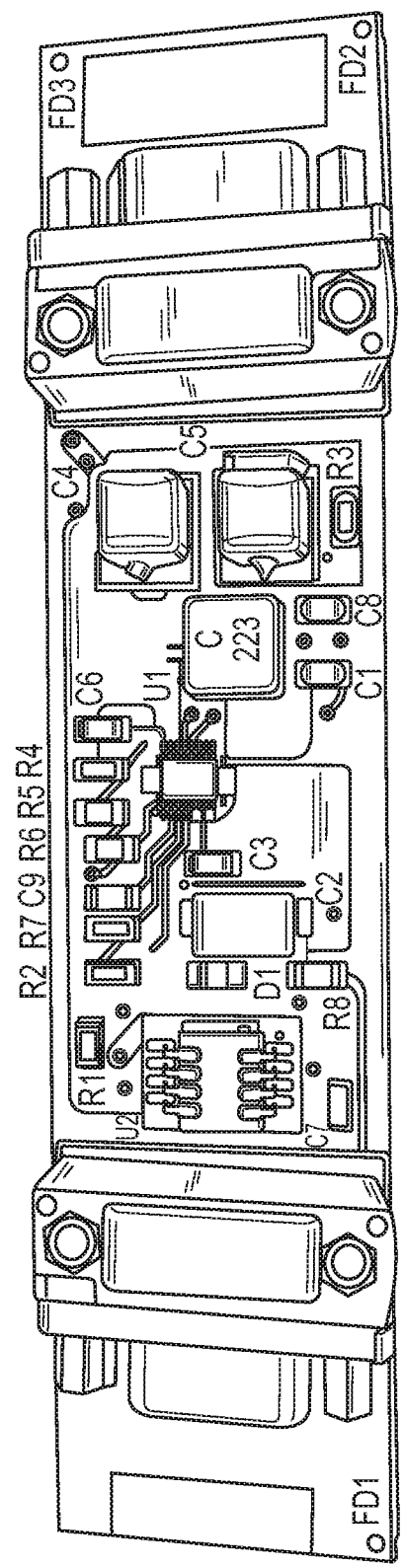
FIG. 2 is a picture of the PCBA of the current disclosure for being tested for durability.
Figure 3:
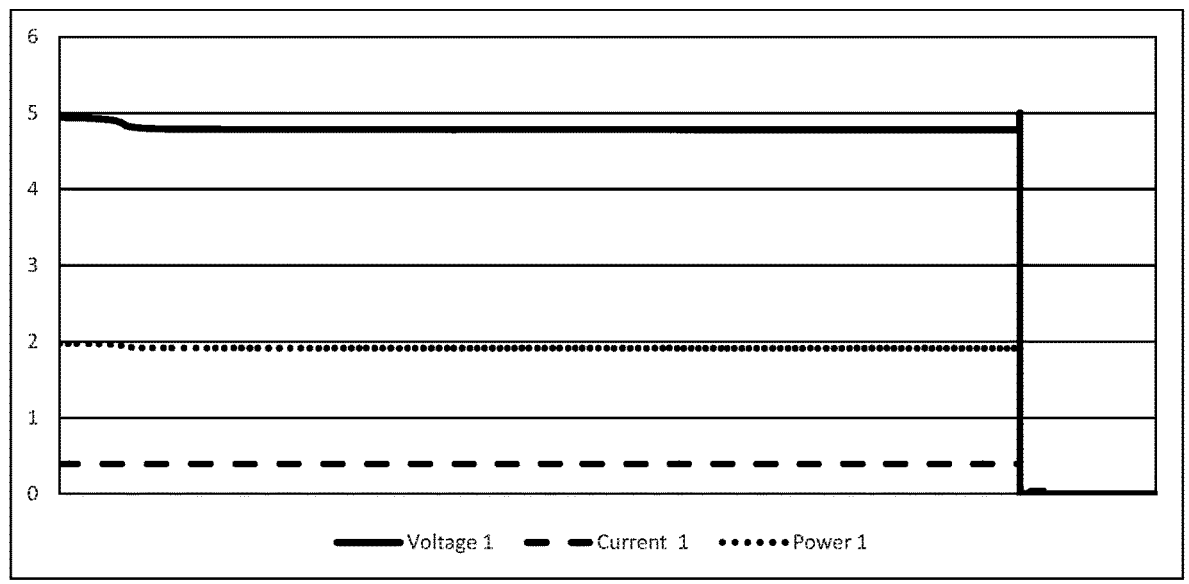
FIG. 3 is a plot showing data at the end of the durability test of the PCBA at 175° C.

A PCBA of the disclosure was tested at 200° C. for high temperature survivability. FIG. 2 is a picture of the tested PCBA. It is connected with a load box set for 5 VDC at 400 mA. LabVIEW was used to control and log data from the power supply. The PCBA was tested continuously for 797 hours at 200° C. in an oven before it failed to meet the requirements set on the load box. FIG. 3 shows data from the last week of testing, indicating a sudden drop of voltage after being in the oven at 200° C. after a cumulative 797 hours.

In addition, a directional drilling module equipped with PCBs of the current disclosure and a plurality of sensors (azimuth, inclination, total H field, total G field, dip angle, etc.) successfully passed a series of tests designed to test the performance in downhole conditions.

In the vibration test, the random vibrations of 20 $G_{rms}$ were applied to the directional drilling module at 175° C. Table 1 compare the shift in sensor signals before and after the tests. Minor shifts were observed but the results were within the specification.

TABLE 1

| 175° C. | | Inc | Before Temp&Vib | After Temp&Vib | Shift |
|---|---|---|---|---|---|
| Azimuth spread [deg] | North | 90 | 0.132 | 0.285 | 0.152 |
| | | 45 | 0.167 | 0.358 | 0.191 |
| | | 10 | 0.072 | 0.293 | 0.221 |
| | | 5 | 0.401 | 0.591 | 0.19 |
| | West | 90 | 0.172 | 0.236 | 0.064 |
| | | 45 | 0.126 | 0.228 | 0.103 |
| | | 10 | 0.31 | 0.352 | 0.042 |
| | | 5 | 0.709 | 0.531 | −0.179 |
| Inclination spread [deg] | North | 90 | 0.038 | 0.078 | 0.04 |
| | | 45 | 0.023 | 0.047 | 0.024 |
| | | 10 | 0.017 | 0.044 | 0.027 |
| | | 5 | 0.023 | 0.043 | 0.02 |
| | West | 90 | 0.04 | 0.085 | 0.045 |
| | | 45 | 0.036 | 0.054 | 0.018 |
| | | 10 | 0.034 | 0.046 | 0.013 |
| | | 5 | 0.036 | 0.047 | 0.011 |
| Total H field spread [nT] | North | 90 | 50.4 | 88.8 | 38.4 |
| | | 45 | 6.8 | 16.5 | 9.7 |
| | | 10 | 23.8 | 79.6 | 55.8 |
| | | 5 | 15.9 | 82.7 | 66.8 |
| | West | 90 | 39.2 | 129.7 | 90.5 |
| | | 45 | 38.3 | 107.4 | 69.1 |
| | | 10 | 21.7 | 89.9 | 68.2 |
| | | 5 | 25.6 | 88.2 | 62.6 |
| | Total | | 50.4 | 152.5 | 102.1 |
| Total g field spread [mG] | North | 90 | 0.28 | 1.5 | 1.22 |
| | | 45 | 0.4 | 1.17 | 0.77 |
| | | 10 | 0.26 | 0.28 | 0.01 |
| | | 5 | 0.18 | 0.19 | 0.01 |
| | West | 90 | 0.64 | 1.39 | 0.75 |
| | | 45 | 0.48 | 1.24 | 0.76 |
| | | 10 | 0.13 | 0.3 | 0.18 |
| | | 5 | 0.07 | 0.1 | 0.03 |
| | Total | | 1.36 | 1.92 | 0.56 |
| Dip Angle spread [deg] | North | 90 | 0.083 | 0.257 | 0.173 |
| | | 45 | 0.078 | 0.278 | 0.199 |
| | | 10 | 0.067 | 0.244 | 0.177 |
| | | 5 | 0.061 | 0.238 | 0.177 |

TABLE 1-continued

| 175° C. | | Inc | Before Temp&Vib | After Temp&Vib | Shift |
|---|---|---|---|---|---|
| | West | 90 | 0.073 | 0.143 | 0.069 |
| | | 45 | 0.113 | 0.241 | 0.128 |
| | | 10 | 0.147 | 0.247 | 0.1 |
| | | 5 | 0.12 | 0.246 | 0.127 |
| | Total | | 0.179 | 0.349 | 0.17 |

In the shock tests, the magnitude of the shocks was 500 G. Each shock was applied as half-sine wave at a duration of 1 ms each in six different directions (i.e., +X, −X, +Y, −Y, +Z, −Z) for 10 shocks in each direction. The PCBA was powered during the shock tests. The shock tests were carried out at room temperature, 150° C., and 175° C., respectively. Table 2 shows the results from various sensors before and after the shock tests at 175° C.

TABLE 2

| 175° C. | | Inc | Before Shock | After Shock | Shift |
|---|---|---|---|---|---|
| Azimuth spread [deg] | North | 90 | 0.1 | 0.122 | 0.022 |
| | | 45 | 0.075 | 0.171 | 0.096 |
| | | 10 | 0.46 | 0.68 | 0.22 |
| | | 5 | 0.998 | 1.102 | 0.104 |
| | West | 90 | 0.065 | 0.035 | −0.03 |
| | | 45 | 0.132 | 0.103 | −0.029 |
| | | 10 | 0.509 | 0.568 | 0.059 |
| | | 5 | 1.047 | 1.158 | 0.111 |
| Inclination spread [deg] | North | 90 | 0.017 | 0.027 | 0.01 |
| | | 45 | 0.062 | 0.074 | 0.011 |
| | | 10 | 0.088 | 0.106 | 0.018 |
| | | 5 | 0.093 | 0.096 | 0.003 |
| | West | 90 | 0.014 | 0.033 | 0.018 |
| | | 45 | 0.078 | 0.068 | −0.01 |
| | | 10 | 0.098 | 0.103 | 0.005 |
| | | 5 | 0.099 | 0.101 | 0.002 |
| Total H field spread [nT] | North | 90 | 36.9 | 94.5 | 57.6 |
| | | 45 | 10.1 | 63.1 | 53 |
| | | 10 | 13.6 | 57.4 | 43.8 |
| | | 5 | 17.9 | 59.4 | 41.5 |
| | West | 90 | 48.6 | 118.7 | 70.1 |
| | | 45 | 36.1 | 92.6 | 56.5 |
| | | 10 | 25.5 | 57.3 | 31.8 |
| | | 5 | 26 | 67.9 | 41.9 |
| | Total | | 48.6 | 140.1 | 91.5 |
| Total g field spread [mG] | North | 90 | 1.51 | 1.75 | 0.24 |
| | | 45 | 1.09 | 1.21 | 0.12 |
| | | 10 | 0.29 | 0.35 | 0.06 |
| | | 5 | 0.3 | 0.18 | −0.12 |
| | West | 90 | 1.77 | 1.78 | 0.01 |
| | | 45 | 1.26 | 1.22 | −0.04 |
| | | 10 | 0.23 | 0.33 | 0.1 |
| | | 5 | 0.12 | 0.16 | 0.04 |
| | Total | | 1.89 | 1.92 | 0.03 |
| Dip Angle spread [deg] | North | 90 | 0.051 | 0.128 | 0.077 |
| | | 45 | 0.035 | 0.107 | 0.072 |
| | | 10 | 0.045 | 0.028 | −0.017 |
| | | 5 | 0.045 | 0.035 | −0.01 |
| | West | 90 | 0.069 | 0.089 | 0.02 |
| | | 45 | 0.066 | 0.069 | 0.003 |
| | | 10 | 0.055 | 0.05 | −0.006 |
| | | 5 | 0.052 | 0.04 | −0.012 |
| | Total | | 0.086 | 0.172 | 0.086 |

Extended roll tests at different temperatures were also carried out. Table 3 shows data from roll tests of the directional module at 175° C. for a cumulative 1000 hours.

TABLE 3

| 175° C. | | Inc | Roll Test Data | | | | Shift from 0 h data | | |
|---|---|---|---|---|---|---|---|---|---|
| | | | 0 h | 200 h | 493 h | 1000 h | 200 h | 493 h | 1000 h |
| Azimuth spread [deg] | North | 90 | 0.137 | 0.203 | 0.196 | 0.223 | 0.066 | 0.06 | 0.087 |
| | | 45 | 0.045 | 0.081 | 0.106 | 0.093 | 0.036 | 0.061 | 0.048 |
| | | 10 | 0.501 | 0.793 | 0.877 | 0.737 | 0.292 | 0.376 | 0.236 |
| | | 5 | 1.178 | 1.886 | 1.783 | 1.866 | 0.707 | 0.604 | 0.688 |
| | West | 90 | 0.066 | 0.059 | 0.048 | 0.078 | −0.007 | −0.018 | 0.012 |
| | | 45 | 0.059 | 0.194 | 0.258 | 0.246 | 0.136 | 0.199 | 0.187 |
| | | 10 | 0.571 | 0.891 | 0.969 | 0.955 | 0.32 | 0.398 | 0.384 |
| | | 5 | 1.134 | 1.828 | 1.647 | 1.581 | 0.695 | 0.514 | 0.447 |
| Inclination spread [deg] | North | 90 | 0.027 | 0.015 | 0.021 | 0.022 | −0.012 | −0.006 | −0.005 |
| | | 45 | 0.07 | 0.113 | 0.116 | 0.103 | 0.042 | 0.046 | 0.032 |
| | | 10 | 0.097 | 0.152 | 0.16 | 0.148 | 0.055 | 0.063 | 0.051 |
| | | 5 | 0.103 | 0.158 | 0.162 | 0.131 | 0.055 | 0.059 | 0.028 |
| | West | 90 | 0.015 | 0.012 | 0.023 | 0.029 | −0.003 | 0.008 | 0.014 |
| | | 45 | 0.082 | 0.119 | 0.113 | 0.105 | 0.037 | 0.031 | 0.023 |
| | | 10 | 0.109 | 0.157 | 0.162 | 0.141 | 0.047 | 0.053 | 0.032 |
| | | 5 | 0.117 | 0.163 | 0.164 | 0.13 | 0.046 | 0.047 | 0.013 |
| Total H field spread [nT] | North | 90 | 22.3 | 53.5 | 45.8 | 41.8 | 31.2 | 23.5 | 19.5 |
| | | 45 | 4.3 | 45.5 | 68 | 17.9 | 41.2 | 63.7 | 13.6 |
| | | 10 | 13.9 | 21.5 | 43 | 30.4 | 7.6 | 29.1 | 16.5 |
| | | 5 | 16.2 | 29 | 32.5 | 37.5 | 12.8 | 16.3 | 21.3 |
| | West | 90 | 25.9 | 74.5 | 48.2 | 56.2 | 48.6 | 22.3 | 30.3 |
| | | 45 | 17.7 | 48.2 | 65.7 | 62.6 | 30.5 | 48 | 44.9 |
| | | 10 | 8.2 | 58.7 | 40.3 | 64.2 | 50.5 | 32.1 | 56 |
| | | 5 | 10.9 | 21.1 | 55.6 | 58.2 | 10.2 | 44.7 | 47.3 |
| | Total | | 45.1 | 82.7 | 104.2 | 99.2 | 37.6 | 59.1 | 54.1 |
| Total g field spread [mG] | North | 90 | 1.44 | 2.24 | 2.05 | 2.46 | 0.81 | 0.62 | 1.02 |
| | | 45 | 1.32 | 1.99 | 1.87 | 1.76 | 0.67 | 0.56 | 0.44 |
| | | 10 | 0.19 | 0.31 | 0.4 | 0.39 | 0.12 | 0.21 | 0.2 |
| | | 5 | 0.08 | 0.16 | 0.16 | 0.17 | 0.08 | 0.07 | 0.09 |
| | West | 90 | 1.37 | 2.21 | 2.3 | 2.36 | 0.84 | 0.93 | 0.98 |
| | | 45 | 1.38 | 1.98 | 1.94 | 1.75 | 0.6 | 0.56 | 0.37 |
| | | 10 | 0.21 | 0.67 | 0.43 | 0.44 | 0.46 | 0.22 | 0.23 |
| | | 5 | 0.13 | 0.29 | 0.2 | 0.19 | 0.16 | 0.07 | 0.06 |
| | Total | | 1.87 | 2.44 | 2.49 | 2.48 | 0.57 | 0.62 | 0.6 |
| Dip Angle spread [deg] | North | 90 | 0.038 | 0.047 | 0.032 | 0.047 | 0.008 | −0.006 | 0.009 |
| | | 45 | 0.075 | 0.132 | 0.176 | 0.132 | 0.057 | 0.101 | 0.058 |
| | | 10 | 0.133 | 0.2 | 0.193 | 0.17 | 0.067 | 0.061 | 0.037 |
| | | 5 | 0.143 | 0.206 | 0.162 | 0.182 | 0.063 | 0.018 | 0.039 |
| | West | 90 | 0.205 | 0.224 | 0.207 | 0.191 | 0.019 | 0.002 | −0.014 |
| | | 45 | 0.121 | 0.184 | 0.188 | 0.206 | 0.063 | 0.067 | 0.085 |
| | | 10 | 0.091 | 0.154 | 0.173 | 0.193 | 0.062 | 0.082 | 0.101 |
| | | 5 | 0.118 | 0.19 | 0.17 | 0.187 | 0.073 | 0.052 | 0.069 |
| | Total | | 0.205 | 0.24 | 0.227 | 0.233 | 0.035 | 0.022 | 0.028 |

In the temperature cycle tests, fifty temperature cycles of the directional module were carried out from room temperature to 175° C. The results are shown in Table 4.

TABLE 4

| 175° C. | | Inc | Roll Test Data | | | Shift from 0 cycle data | |
|---|---|---|---|---|---|---|---|
| | | | 0 cycle | 50 cycle | 100 cycle | 50 cycle | 100 cycle |
| Azimuth spread [deg] | North | 90 | 0.173 | 0.144 | 0.174 | −0.029 | 0.001 |
| | | 45 | 0.124 | 0.105 | 0.071 | −0.019 | −0.052 |
| | | 10 | 0.106 | 0.247 | 0.515 | 0.141 | 0.409 |
| | | 5 | 0.416 | 0.743 | 1.263 | 0.327 | 0.847 |
| | West | 90 | 0.05 | 0.089 | 0.093 | 0.039 | 0.043 |
| | | 45 | 0.064 | 0.133 | 0.13 | 0.069 | 0.066 |
| | | 10 | 0.212 | 0.438 | 0.639 | 0.226 | 0.427 |
| | | 5 | 0.436 | 0.797 | 1.606 | 0.361 | 1.171 |
| Inclination spread [deg] | North | 90 | 0.012 | 0.03 | 0.023 | 0.018 | 0.012 |
| | | 45 | 0.025 | 0.074 | 0.095 | 0.049 | 0.07 |
| | | 10 | 0.026 | 0.061 | 0.104 | 0.034 | 0.078 |
| | | 5 | 0.03 | 0.076 | 0.105 | 0.045 | 0.074 |
| | West | 90 | 0.019 | 0.022 | 0.032 | 0.003 | 0.013 |
| | | 45 | 0.03 | 0.08 | 0.081 | 0.05 | 0.051 |
| | | 10 | 0.033 | 0.074 | 0.116 | 0.04 | 0.083 |
| | | 5 | 0.029 | 0.07 | 0.109 | 0.041 | 0.08 |

TABLE 4-continued

| 175° C. | | Inc | Roll Test Data | | | Shift from 0 cycle data | |
|---|---|---|---|---|---|---|---|
| | | | 0 cycle | 50 cycle | 100 cycle | 50 cycle | 100 cycle |
| Total H field spread [nT] | North | 90 | 23 | 38.9 | 33.3 | 15.9 | 10.3 |
| | | 45 | 34.5 | 27.6 | 21.5 | −6.9 | −13 |
| | | 10 | 18.8 | 39.6 | 33.4 | 20.8 | 14.6 |
| | | 5 | 8.6 | 45.8 | 54.2 | 37.2 | 45.6 |
| | West | 90 | 10.5 | 62.2 | 31.1 | 51.7 | 20.6 |
| | | 45 | 10.5 | 27.6 | 65.7 | 17.1 | 55.2 |
| | | 10 | 18.6 | 40.6 | 42.4 | 22 | 23.8 |
| | | 5 | 5.1 | 25.2 | 51.2 | 20.1 | 46.1 |
| | Total | | 65 | 65.4 | 72 | 0.4 | 7 |
| Total g field spread [mG] | North | 90 | 0.61 | 1.11 | 1.67 | 0.5 | 1.06 |
| | | 45 | 0.44 | 0.66 | 1.14 | 0.22 | 0.7 |
| | | 10 | 0.17 | 0.14 | 0.3 | −0.03 | 0.13 |
| | | 5 | 0.14 | 0.05 | 0.1 | −0.08 | −0.04 |
| | West | 90 | 0.57 | 1.13 | 1.68 | 0.56 | 1.11 |
| | | 45 | 0.43 | 0.74 | 1.05 | 0.31 | 0.62 |
| | | 10 | 0.12 | 0.22 | 0.24 | 0.09 | 0.12 |
| | | 5 | 0.14 | 0.06 | 0.11 | −0.08 | −0.03 |
| | Total | | 0.98 | 1.25 | 1.85 | 0.26 | 0.87 |
| Dip Angle spread [deg] | North | 90 | 0.033 | 0.082 | 0.076 | 0.049 | 0.044 |
| | | 45 | 0.06 | 0.135 | 0.117 | 0.074 | 0.057 |
| | | 10 | 0.045 | 0.105 | 0.143 | 0.06 | 0.097 |
| | | 5 | 0.045 | 0.113 | 0.137 | 0.068 | 0.091 |
| | West | 90 | 0.066 | 0.079 | 0.114 | 0.012 | 0.047 |
| | | 45 | 0.036 | 0.116 | 0.175 | 0.08 | 0.139 |
| | | 10 | 0.08 | 0.111 | 0.126 | 0.031 | 0.045 |
| | | 5 | 0.067 | 0.136 | 0.13 | 0.069 | 0.062 |
| | Total | | 0.111 | 0.148 | 0.197 | 0.037 | 0.086 |

Field Tests

Figure 4:
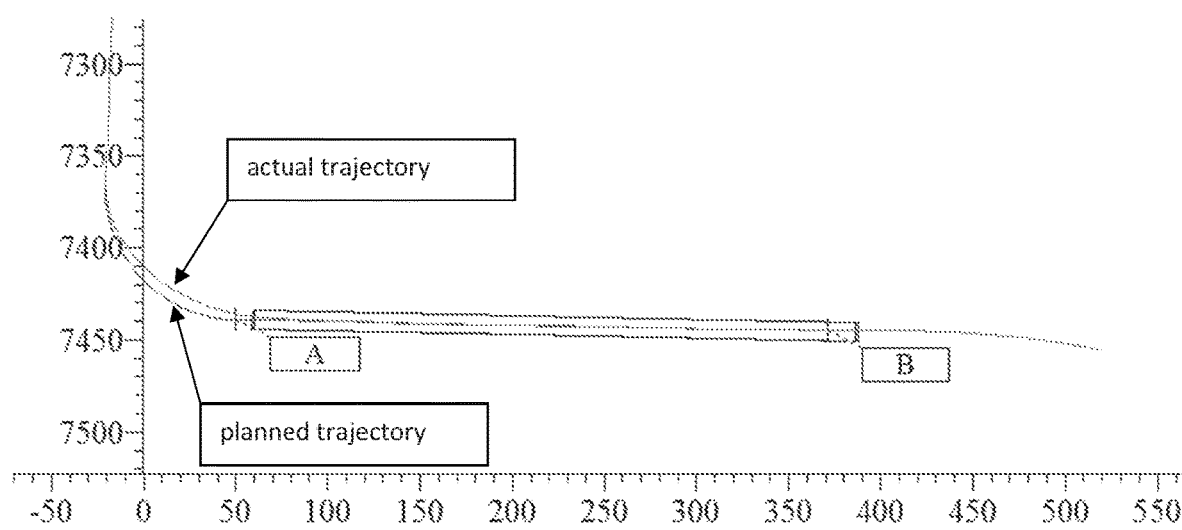
FIG. 4 shows a section of the profile of directional drilling in a field test.

A MWD instrument containing a PCBA of the current disclosure was field tested in directional drilling. FIG. 4 shows a section in the profile of the directional drilling. Table 55 shows data corresponding to the section in FIG. 4. The well has a total depth of 7947 m. The vertical section has a depth of 7456 m and the horizontal section has a total length of 521 m. The build section is between a depth of about 7372 m to about 7480 m. The horizontal section started at point A, which has a horizontal displacement of about 50 meters. Point B is the position of the drill bit. The temperature in the pay zone is about 165-170° C. The MWD instrument operated for 297 hours downhole before it failed and was replaced.

TABLE 5

| Well Depth (m) | Vertical Depth (m) | Horizontal Displacement (m) | Azimuth (°) | Well Deflection (°) |
|---|---|---|---|---|
| 7402 | 7398 | −10 | 34.7 | 292.2 |
| 7411 | 7406 | −4 | 41.9 | 291.4 |
| 7421 | 7413 | 3 | 47.6 | 294.0 |
| 7431 | 7419 | 10 | 53.4 | 292.4 |
| 7440 | 7424 | 18 | 59.5 | 290.8 |
| 7450 | 7428 | 26 | 64.7 | 290.1 |
| 7469 | 7432 | 44 | 76.8 | 289.0 |
| 7478 | 7435 | 54 | 82.1 | 286.0 |
| 7498 | 7438 | 73 | 86.2 | 286.6 |
| 7527 | 7440 | 102 | 87.9 | 285.8 |
| 7575 | 7441 | 150 | 88.0 | 287.4 |
| 7623 | 7442 | 198 | 90.1 | 288.0 |
| 7681 | 7443 | 256 | 88.3 | 288.6 |
| 7729 | 7444 | 304 | 89.6 | 287.0 |
| 7778 | 7444 | 352 | 89.7 | 287.4 |
| 7826 | 7445 | 400 | 89.6 | 287.8 |
| 7874 | 7446 | 448 | 87.1 | 286.6 |
| 7922 | 7451 | 496 | 80.4 | 286.7 |
| 7947 | 7456 | 521 | 80.0 | 286.3 |

While in the foregoing specification this disclosure has been described in relation to certain preferred embodiments thereof, and many details have been set forth for purpose of illustration, it will be apparent to those skilled in the art that the disclosure is susceptible to alteration and that certain other details described herein can vary considerably without departing from the basic principles of the disclosure. In addition, it should be appreciated that structural features or method steps shown or described in any one embodiment herein can be used in other embodiments as well.

What is claimed is:

1. A method for preparing a printed circuit board assembly (PCBA), comprising:
   cleaning the surface of the PCBA with a cleaner, wherein the PCBA has a base circuit board having a plurality of electronic components installed thereon;
   preparing a staking material;
   applying the staking material around a circumference of the plurality of electronic components;
   curing the staking material; and
   inspecting the PCBA.

2. The method according to claim 1, wherein the cleaner is a material that does not degrade the base circuit board or the plurality of electronic components.

3. The method according to claim 1, wherein the cleaner is isopropyl alcohol.

4. The method according to claim 1, further comprising drying the PCBA after the cleaning at 120° C. to 130° C. for at least two hours.

5. The method according to claim 1, wherein the staking material is not applied to the top of screws or nuts in the PCBA.

6. The method according to claim 1, wherein the PCBA comprises one or more stiffeners to increase a rigidity of the PCBA.

7. The method according to claim 1, wherein the one or more stiffeners and the base circuit board are made of a same material.

8. The method according to claim 7, wherein the one or more stiffeners and the base circuit board are made of polyimide.

9. The method according to claim 1, further comprising installing one or more silicone foam pad over a top of one or more electronic components.

10. The method according to claim 1, wherein one or more of the plurality of electronic component is a tantalum capacitor.

11. The method according to claim 10, wherein the tantalum capacitor is a wrapped tantalum capacitor or a solid tantalum capacitor.

12. The method according to claim 1, wherein one or more of the plurality of electronic components is a crystal component.

13. The method according to claim 1, wherein one or more of the plurality of electronic components is a transformer.

14. The method according to claim 1, wherein the staking material is cured at 130° C. for 60 minutes.

15. The method according to claim 1, further comprising removing one or more of the plurality of electronic components for the PCBA.

16. The method according to claim 15, further comprising removing the staking material disposed about the one or more of the plurality of electronic components to be removed.

* * * * *